(12) United States Patent
Broglia et al.

(10) Patent No.: US 6,493,240 B2
(45) Date of Patent: Dec. 10, 2002

(54) INTERPOSER FOR CONNECTING TWO SUBSTRATES AND RESULTING ASSEMBLY

(75) Inventors: Patrizio Broglia, Milan (IT); Francesco Garbelli, Milan (IT); Alberto Monti, Milan (IT)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/859,252

(22) Filed: May 17, 2001

(65) Prior Publication Data

US 2001/0046129 A1 Nov. 29, 2001

(30) Foreign Application Priority Data

May 24, 2000 (GB) .............................................. 0012420

(51) Int. Cl.[7] .............................. H05K 1/11; H05K 1/14
(52) U.S. Cl. ................. 361/803; 361/743; 361/774; 361/770; 361/804; 361/736; 361/758; 439/83; 439/74
(58) Field of Search ................................. 361/735, 760, 361/790, 803, 743, 758, 767, 785, 736, 748, 808, 774, 770, 813, 829, 769, 787

(56) References Cited

U.S. PATENT DOCUMENTS

| | | | | |
|---|---|---|---|---|
| 4,770,641 A | * | 9/1988 | Rowlette | 439/86 |
| 5,474,458 A | * | 12/1995 | Vafi et al. | 439/91 |
| 5,491,303 A | * | 2/1996 | Weiss | 174/262 |
| 5,969,952 A | * | 10/1999 | Hayashi et al. | 257/696 |
| 6,404,043 B1 | * | 6/2002 | Isaak | 257/685 |

* cited by examiner

*Primary Examiner*—David Martin
*Assistant Examiner*—Thanh Y. Tran
(74) *Attorney, Agent, or Firm*—Lawrence R. Fraley

(57) ABSTRACT

The present invention is an interposer for electrically coupling a microcard with a mother board. The interposer includes a frame which is interposed between the microcard and the motherboard, electrically connecting the microcard and the motherboard by means of plated via-holes. The substrate is organic and a plurality of chips are mounted on both sides of the substrate. On the opposite sides of the interposer are pluralities of metal pads which are coupled by metallized via holes, the pads in turn connected to the chips, thereby coupling chips or cards on one side of the interposer to chips or boards on the other side. Electrical connection between the chips on the top side of the substrate and the metal pads on the lower side of the substrate is provided by the metallized via holes.

5 Claims, 3 Drawing Sheets

INTERPOSER FOR CONNECTING TWO SUBSTRATES AND RESULTING ASSEMBLY

FIELD OF THE INVENTION

The present invention relates to microcards and more particularly to a method and system for connecting microcards to motherboards by means of an interposer.

BACKGROUND OF THE INVENTION

A microcard is an electronic card assembly generally characterized by small size (e.g. PCMCIA or credit card size or less) and is typically densely populated with a variety of miniaturized SMT components like BGA (Ball Grid Array) modules, CSPs (Chip Scale Packages), Flip Chip or wire bond DCA (Direct Chip Attach) modules. A microcard may be populated on one or both sides of its substrate (board). FIG. 1 shows an example of a known microcard. Microcard 101 has a substrate 103 and a plurality of active devices 105 on both sides of substrate 103. Interconnection of the microcard to the "external world" (e.g. motherboard 107 as shown in FIG. 1 or higher level assembly level) is obtained through connector 109a (male or female type) which fits into a corresponding connector 109b on motherboard 107. The connector hosts a plurality of metallic pins that are put in mechanical contact with the corresponding pins in the matched connector placed on the motherboard or other assembly.

In some of the recent electronic applications (e.g. microcards for mobile phones), the size of the electronic modules is becoming more and more critical. Many functions must be implemented in a very limited space, so that many active devices should be placed on a single module. As mentioned above, to increase the usable surface area on a substrate, it is known to use both faces of the substrate to mount active devices. For this reason a "vertical" mounting as described with reference to FIG. 1 has been the usual mounting method. However, it is evident that this method, with microcard 101 mounted perpendicularly with respect to motherboard 107, provides a relatively poor solution when space saving (e.g., of the overall height of the assembly) is an important requirement. Another drawback of this package is that handling by automatic pick and place systems, the usual machinery for assembling such components, is relatively difficult.

It is known to mount a microcard having electronic components on both sides, like the one shown in FIG. 1, by means of so-called "gull wing" connections. As shown in FIG. 2, using this method, the microcard, with its attached components can be mounted parallel to the motherboard, allowing the resulting package (usually called Flat Pack MCM) to be picked and placed by automatic handling machines. However the following drawbacks are introduced by these gull-wing connections: (1) the resulting package is very delicate from a mechanical point of view, due to the leads which can easily bend; (2) maximum size of the usable substrate is limited by intrinsic warpage of organic composites, which causes problems of lack of coplanarity; and (3) the assembly of peripheral gull-wing leads requires dedicated equipment.

It is an object of the present invention to provide a technique which alleviates the above drawbacks.

SUMMARY OF THE INVENTION

According to one aspect of the present invention, there is provided an interposer for electrically connecting an electronic card (a/k/a microcard) with a motherboard, the interposer including a first plurality of metal pads located on a first side of the interposer and electrically connectable to the circuit traces on the electronic card, a second plurality of metal pads located on a second side of the interposer and electrically connectable to the circuit traces on the circuit board, and a plurality of plated via holes therein extending from the first side of the interposer to the second side of the interposer for electrically connecting selected ones of the first plurality of metal pads to selected ones of the second plurality of metal pads when the interposer is positioned substantially between the electronic card and the circuit board to thereby electrically connect the electronic card to the circuit board.

As defined herein, the present invention allows the use of low cost, commonly available, base organic material to connect a microcard with a mother board, while realizing a stable operating assembly.

According to another aspect of the present invention, there is provided an electrical assembly including an electronic card having circuit traces thereon, a circuit board having circuit traces thereon, and an interposer positioned between the electronic card and the circuit board and electrically connecting selected ones of the circuit traces of the electronic card to selected ones of the circuit traces of the circuit board, the interposer including a first plurality of metal pads located on a first side of the interposer and electrically connected to the circuit traces on the electronic card, a second plurality of metal pads located on a second side of the interposer and electrically connected to the circuit traces on the circuit board, and a plurality of plated via holes therein extending from the first side of the interposer to the second side of the interposer for electrically connecting selected ones of the first plurality of metal pads to selected ones of the second plurality of metal pads when the interposer is positioned between the electronic card and the circuit board to thereby electrically connect the electronic card to the circuit board.

According to still another aspect of the present invention, there is provided a method of connecting circuitry on an electronic card to circuitry on a circuit board including the steps of positioning the circuit board having the circuit traces thereon in a first position, positioning an electronic card having the circuit traces thereon in a second position spacedly located from the first position of the circuit board, positioning an interposer between the electronic card and the circuit board, the interposer including a first plurality of metal pads on a first side thereof and a second plurality of metal pads on a second side thereof opposite the first side, the interposer further including a plurality of plated via holes therein electrically connecting selected ones of the first plurality of metal pads to selected ones of the second plurality of metal pads, and electrically coupling selected ones of the plurality of plated via holes to selected ones of the circuit traces on the electronic card to selected ones of the circuit traces on the circuit board.

BRIEF DESCRIPTION OF THE DRAWINGS

The above and other advantages of the present invention will be better understood with reference to the following FIGS., where.

DETAILED DESCRIPTION OF THE PREFERRED EMBODIMENTS

Figure 1:
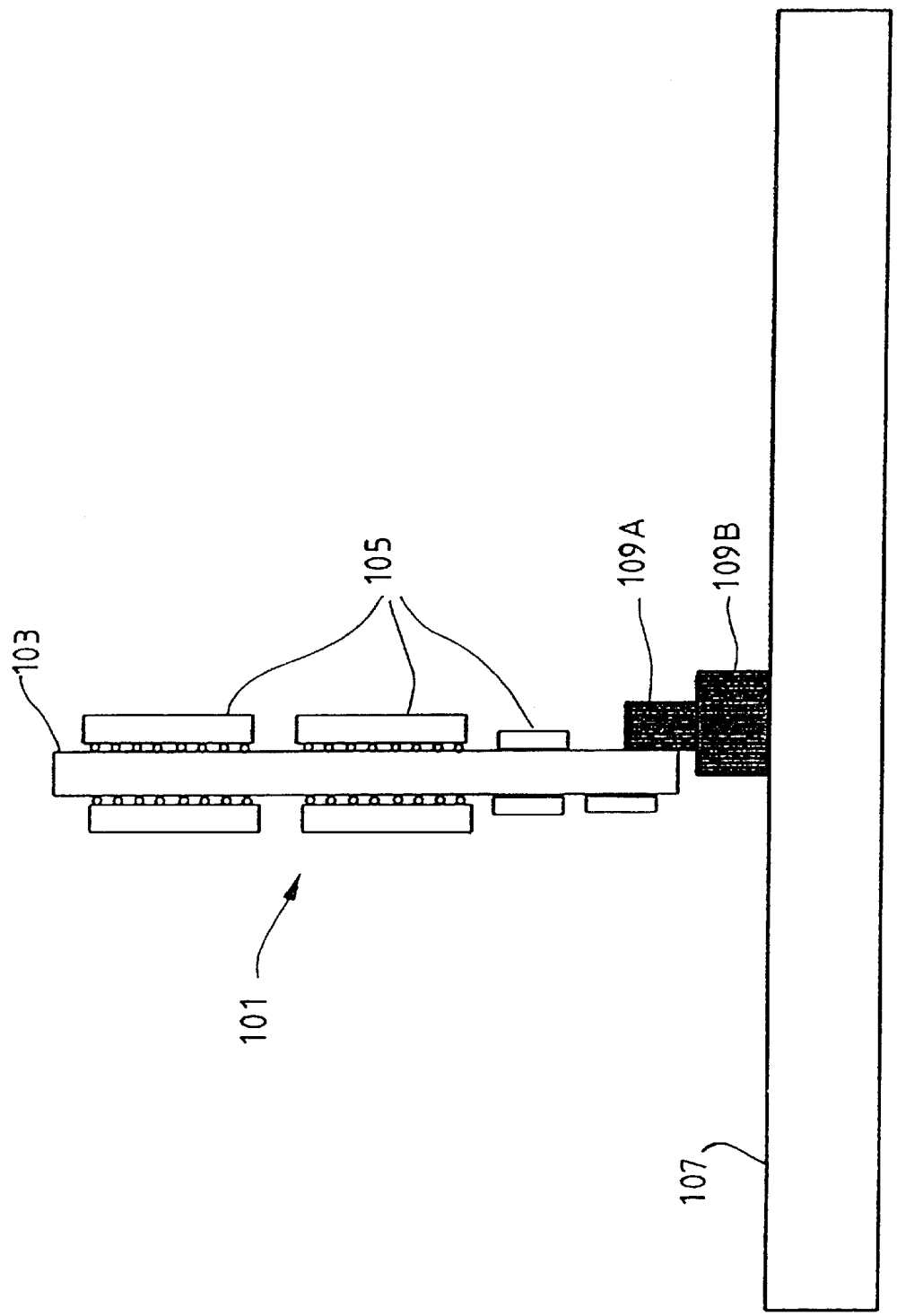
FIG. 1 is front elevational view of a known electronic card structure positioned on a circuit board.
Figure 2:
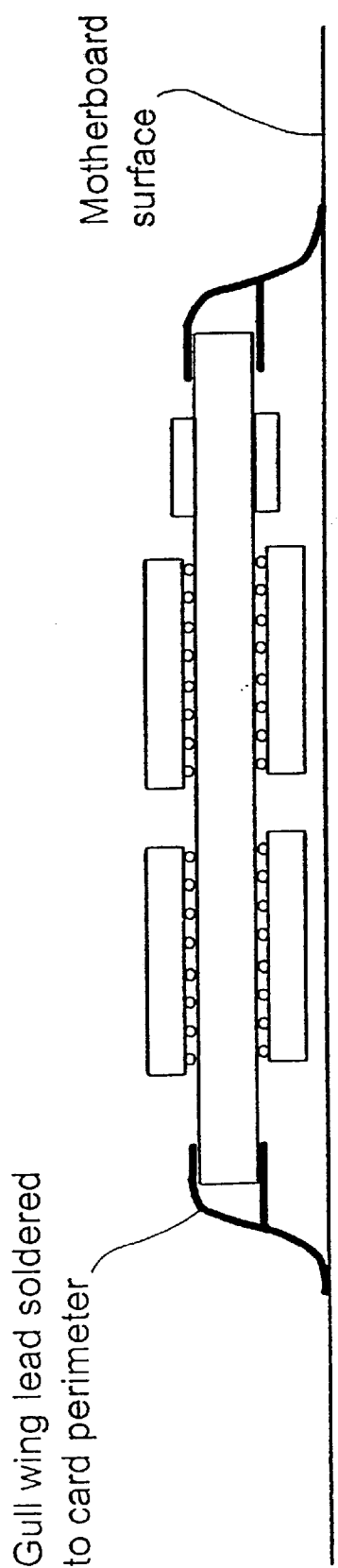
FIG. 2 is a front elevational view of a known "gull-wing"connected card and board assembly.
Figure 3:
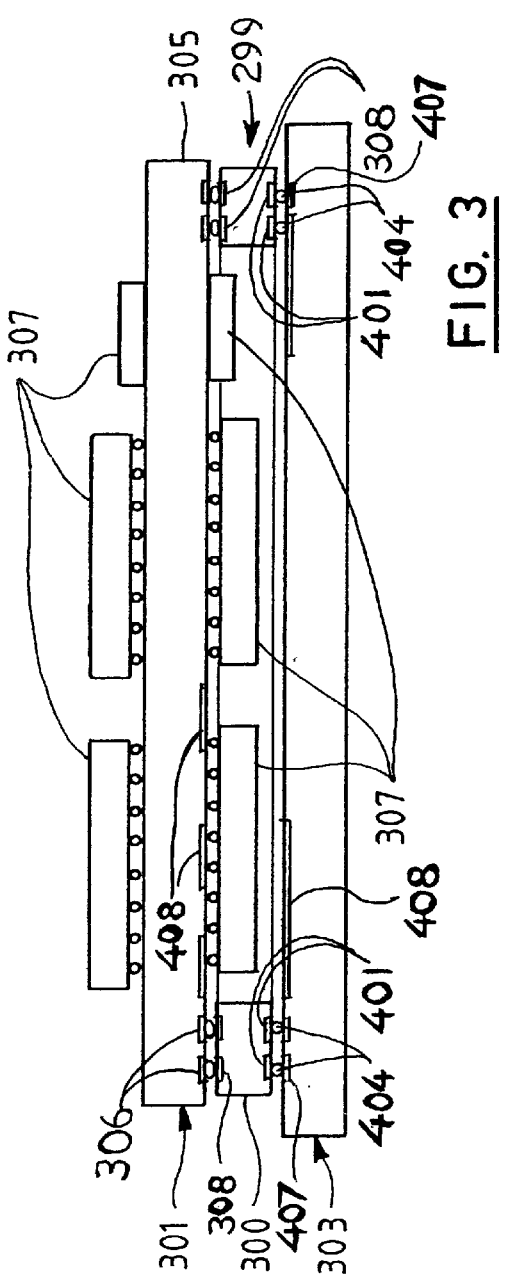
FIG. 3 is a front elevational view of an interposer according to a preferred embodiment of the present invention, which is used to electronically couple card and board components.
Figure 4:
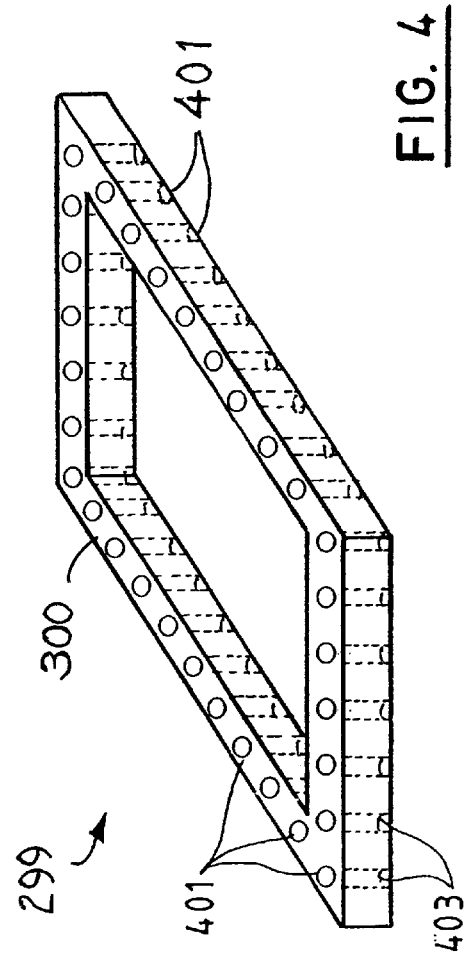
FIG. 4 is a perspective view of a preferred embodiment of the interposer of FIG. 3, without card and board components being shown.

According to a preferred embodiment of the present invention, the connection between an electronic card (a/k/a microcard) and a circuit board (a/k/a motherboard) is realized by means of an interposer 299. As schematically shown in FIG. 3, interposer 299 includes a frame 300 which is "interposed" between card 301 and board 303, electrically connecting the card and board by conductive metal pads 401 (FIG. 4) with interconnecting plated via-holes 403 (FIG. 4). In a preferred embodiment of the present invention, substrate 305 is organic and a plurality of chips 307 are mounted on opposite (top and bottom) sides of the card's substrate 305. On the lower side of substrate 305 are located a plurality of metal pads 306, which, in a preferred embodiment, correspond to a plurality of metal pads 308 on the upper surface of the interposer. Electrical connection between chips 307 on the top side of substrate 305 and metal pads 306 on the lower side of the substrate is accomplished by means of metallized via holes (not shown in FIG. 3) similar, for example, to those shown in FIG. 4.

Interposer 299 is designed in order to fit specific sizes and geometric constraints of various card and board structures, and is thus very adaptable. The thickness of the interposer can be adjusted in order to assure specific gap sizes. As shown in both FIGS. 3 and 4, according to a preferred embodiment of the present invention, the bottom side of interposer 299 also has a plurality of metal pads 401 for receiving standard (e.g., eutectic) solder balls 404 identical to the solder balls used for known PBGA applications. As mentioned above, the top side of the interposer frame 300 (the one in contact with the bottom side of card 305) has a plurality of metal pads 308 which correspond to a plurality of metal pads on card 305. The interposer is preferably attached to the card by soldering (e.g., a conventional reflow process). This can be accomplished either during the standard assembly processes through solder paste screen printing or applying solder balls before assembly so that the metal pads on substrate 305 are electrically connected with metal pads 308. Metal pads 401 on the bottom side of interposer 300 are electrically connected to the metal pads on the top side by means of plated (conductive) via holes 403 (FIG. 4), which can be drilled into frame 300. The interposer can also be prepared for assembly separately. In either case, the assembly process is simplified. In addition to having pads on both card 305 and board 303 (pads 407 shown in FIG. 3 for board 303) as part of the circuit traces (circuitry) of both card and board, it is readily understood that additional circuit traces (e.g., circuit lines 408) also form part of the card's and board's exposed conductive surfaces. Such circuit lines are known on cards and boards to electrically connect components such as surface-mounted chips or modules to pads or the like, and further description is not believed necessary.

Plated via holes 403 (a/k/a plated through holes or PTHs) are preferably formed in accordance with known plating technology and further description is not necessary. Pads 401 on both the top and bottom surfaces of frame 300, as well as pads 306 and 407, can also be formed using conventional technology. The same holds true for circuit lines 408 on card 301 and board 303. Finally, conventional solder balls may also be used to electrically couple components 307 to opposite sides of card 301, a typical process being solder reflow in an appropriate oven.

The above described solution provides the advantage of creating a gap between the bottom side of module card 301 and the motherboard 303 upper surface, allowing both sides of the card to be used for component assembly, while realizing a flat and robust package. This increases the number of overall components assembled onto card 301 thus achieving highly advantageous miniaturization for the resulting electrical assembly (card, board and interposer). The use of an interposer according to a preferred embodiment of the present invention can transform a card (e.g. microcard) into a single structure with complex functions that is surface mountable to a motherboard like any standard SMT device. This feature allows for all the benefits of SMT components, such as automatic placement and simplification of motherboard design, thereby reducing assembly costs.

According to a preferred embodiment of the present invention, interposer 299 is realized using similar materials to those used in the manufacturing of known printed circuit boards and cards, e.g., a known such material referred to in the art as "FR4" dielectric material. Therefore, the substrate material for interposer 299 may have substantially the same Thermal Coefficient of Expansion (TCE) as laminate substrate 303. This feature reduces the likelihood of a warpage problem, which is a serious problem with prior art solutions like gull-wing connectors, as described above.

While there have been shown and described what are at present considered to be the preferred embodiments of the invention, it will be obvious to those skilled in the art that various changes and modifications may be made therein without departing from the scope of the invention as defined by the appended claims.

What is claimed is:

1. An electronic assembly comprising:
   an electronic card having first and second opposing sides and a plurality of conductive pads located along the outer portions of said first of said opposing sides;
   a plurality of electronic components positioned on each of said first and second opposing sides of said electronic card;
   a circuit board having a plurality of conductive pads located on said circuit board and of a pattern substantially similar to said conductive pads on said first opposing side of said electronic card; and
   an interposer for electrically connecting said electronic components on said electronic card to said plurality of conductive pads on said circuit board, said interposer including a frame member having first and second opposing sides, a peripheral portion, and defining an opening therein, said frame member including a plurality of conductive pads on each of said first and second opposing sides of said frame and extending around said peripheral portion of said frame member, said conductive pads on said first and second opposing sides of said frame being electrically coupled to said conductive pads on said electronic card and said circuit board, respectively, by solder balls.

2. The electrical assembly of claim 1 wherein each of said plurality of electronic components positioned on said first and second opposing sides of said electronic card are soldered to said electronic card.

3. The electrical assembly of claim 1 wherein said electronic components positioned on said first opposing side of said electronic card are also substantially positioned within said opening defined by said frame member of said interposer.

4. The electrical assembly of claim 1 wherein said interposer includes a plurality of vias therein, each of said vias electrically coupling one of said conductive pads on said first opposing side of said frame with a respective one of said conductive pads on said second opposing side of said frame.

5. The electrical assembly of claim 1 wherein said electronic card and said interposer have substantially similar coefficients of thermal expansion.

* * * * *